(12) United States Patent
Sasson

(10) Patent No.: US 9,191,903 B2
(45) Date of Patent: Nov. 17, 2015

(54) REMOTE ANTENNA UNIT WITH EXTERNAL POWER CONTROL USING A SINGLE CONTROL LINE

(75) Inventor: Nir Sasson, Ein Sarid (IL)

(73) Assignee: Autotalks LTD, Kfar Netter (IL)

( * ) Notice: Subject to any disclaimer, the term of this patent is extended or adjusted under 35 U.S.C. 154(b) by 134 days.

(21) Appl. No.: 14/232,275

(22) PCT Filed: Nov. 2, 2011

(86) PCT No.: PCT/IB2011/054868
§ 371 (c)(1),
(2), (4) Date: Jan. 12, 2014

(87) PCT Pub. No.: WO2013/030633
PCT Pub. Date: Mar. 7, 2013

(65) Prior Publication Data
US 2014/0148214 A1     May 29, 2014

Related U.S. Application Data

(60) Provisional application No. 61/530,422, filed on Sep. 2, 2011.

(51) Int. Cl.
| | | |
|---|---|---|
| H04B 7/00 | (2006.01) | |
| H04W 52/18 | (2009.01) | |
| H01Q 1/32 | (2006.01) | |
| H03G 3/30 | (2006.01) | |
| H04W 88/08 | (2009.01) | |

(52) U.S. Cl.
CPC ............... *H04W 52/18* (2013.01); *H01Q 1/32* (2013.01); *H01Q 1/3275* (2013.01); *H03G 3/3042* (2013.01); *H04W 88/085* (2013.01)

(58) Field of Classification Search
CPC .............................. H01Q 1/32; H01Q 1/3275
USPC ............... 455/522, 69, 68, 127.1, 127.2, 126, 455/517, 550.1, 557, 569.2, 572, 575.6, 455/90.1–90.3, 344, 347, 426.1, 426.2, 455/422.1, 403, 507; 343/702, 711, 712, 343/713
See application file for complete search history.

(56) References Cited

U.S. PATENT DOCUMENTS 6,256,483 B1 *   7/2001   Moerder et al. ........... 455/115.1
2008/0175212 A1   7/2008   Angell et al.

OTHER PUBLICATIONS

PCT/IB2011/054868 Search Report of the international search authority, Aug. 2013.

* cited by examiner

*Primary Examiner* — Keith Ferguson
(74) *Attorney, Agent, or Firm* — Nathan & Associates Patent Agents Ltd.; Menachem Nathan

(57) ABSTRACT

Apparatus and methods for efficient external control of the transmit power of a remote fixed gain antenna unit in RF communications. Apparatus embodiments include a separate feeding unit coupled to a remote fixed gain antenna unit through a single coaxial line. The feeding unit is operative to provide transmit control signals to the remote antenna unit based on power feedback created in the remote antenna unit and sent to the feeding unit over the single coaxial line. Feedback and transmit/receive control inputs are transmitted through the single coax line together with RF signals. The coax line may be long. The apparatus and methods may be used in a vehicular environment.

17 Claims, 4 Drawing Sheets

REMOTE ANTENNA UNIT WITH EXTERNAL POWER CONTROL USING A SINGLE CONTROL LINE

CROSS REFERENCE TO RELATED APPLICATIONS

This application is related to and hereby claims the priority benefit of commonly-owned U.S. Provisional Patent Application No. 61/530,422 titled "Method and system for remote antenna unit with an external power control using a single control line" and filed Sep. 2, 2011.

FIELD

Embodiments of the invention relate generally to radio frequency (RF) communication apparatus using remote antenna units and more particularly to apparatus and methods for external power control of remote fixed gain antenna units using a single long coaxial connection (the latter also referred to herein as "coaxial line" or "coax line").

BACKGROUND

A remote antenna unit is required where physical or thermal limitations prevent placing an entire communication unit/device in an antenna unit. Such limitations may exist for example for an antenna installed on a vehicle roof, an antenna exposed to high or low temperatures, or an antenna requiring a defined and restricting mechanical size and/or shape, the latter arising from practical and/or aesthetic considerations. If the distance between the remote antenna unit and the communication unit is relatively small (e.g. less than 1 meter), the two may be connected by a coax line. However, for larger distances or when the frequency band employed is above several (e.g. 5) GHz, the attenuation is too high and coax line loss degrades performance. The performance loss is duplicated for Transmit (TX) and Receive (RX) functionality. For example, an apparently "low" attenuation of 3 dB translates into 6 dB total attenuation, because the Transmit power is 3 dB lower than a maximal power amplifier output and the Receive sensitivity is 3 dB higher than optimally achievable.

There are three known types of remote antenna units: a) without any amplification (passive); b) with fixed gain but no power control loop in the antenna unit; and c) with variable gain and power control loop in the antenna unit. Type (a) is trivial and is commonly used. Type (b) is unusable. Regarding type (c), the known art may be understood with reference to, exemplarily, U.S. Pat. No. 7,965,977 by Angell et al. Such known art is shown schematically in FIG. 1, in which an apparatus embodiment 100 comprises a remote variable gain antenna unit 101 coupled to a feeding (communication) unit 102 through a long coax line 116. As used herein, "long" with reference to coax lines refers to a length greater than about 1 meter for frequencies greater than about 5 GHz. The antenna unit is further coupled to an antenna 120.

Feeding unit 102 includes a feeding transceiver 110 for up-converting and down-converting RF signals and a baseband device 112 for modem signal processing and for controlling the transceiver mode of operation and communicating this mode to the remote antenna unit. Remote antenna unit 101 includes a power control module 104, a TX/RX control module 106 and a RF circuits module 108. Power control module 104 controls the power and gain of a power amplifier (not shown) in RF circuits module 108, while TX/RX control module 106 controls the mode of operation (i.e. Transmit or Receive) of RF circuits module 108. RF circuits module 108 further includes a low noise amplifier (LNA) (not shown) and switches (not shown) which compensate for coax line losses and facilitate the sharing of TX/RX and RF lines on coax line 116. Diplexers 114 are provided in both remote antenna unit 101 and feeding unit 102 and are used for combining the TX/RX control line signals with the RF signal on the same coax line (116). Coax line 116 carries three signals: a Transmit RF signal 140, a Receive RF signal 142, and a TX/RX control 146. The Transmit RF signal and the TX/RX controls are sent from the feeding unit to the remote antenna unit, while the Receive RF signal is sent in the opposite direction. Antenna 120 may be placed on a printed circuit board carrying the RF circuits, or connected through a very short coax line to module 108.

Power control is essential for compensating for component behavior in view of temperature changes, lifetime changes and manufacturing differences. Exemplarily, an outdoor antenna unit is exposed to higher temperature variations than an indoor antenna unit. At high frequencies, RF component properties tend to change considerably due to the factors mentioned above. An enhanced level of power control may be achieved by setting a different power per packet. However, while required with most modern communication protocols, this enhanced level cannot be supported with the configuration in FIG. 1.

The implementation of power control inside a remote variable gain antenna unit (e.g. power control module 104) is possible only when all three conditions listed next are met:

a) The transmission power is fixed—i.e. all packets are transmitted using the same power. Most modern communication systems apply dynamic transmission power control. If transmission power control is performed in the antenna unit, then the information of the present transmission power has to be provided to the remote antenna. This is not possible with a single control line (116) of the type disclosed in U.S. Pat. No. 7,965,977.

b) The amplifier output power is not high. Adjustment of transmission power at the power amplifier can be performed only when its output is relatively low. It cannot be performed when it is high, since then it may result in unstable or non-linear operation.

c) The antenna unit size requirements are not restricting—i.e. room exists for implementing the power control function in the remote antenna unit.

When at least one of these three conditions is not met, a new scheme is needed. Some applications, such as vehicle-to-vehicle communications, fail to satisfy all three conditions. There is therefore a need for and it would be advantageous to have methods and apparatuss for efficient external control of the Transmit power of a remote fixed gain antenna unit with power feedback, in particular (but not limited to) for efficient external control performed over a single coax line in a vehicular environment.

SUMMARY

In various embodiments, there are provided apparatus and methods for transmission power control in a remote fixed gain antenna unit. Such apparatus and methods may be used for extending the range of a Wireless Access Point (WAP) with one or more remote antenna circuits. The WAP may be in a vehicle-to-vehicle (V2V) environment. The antenna unit has fixed gain and internal power feedback and is connected to a separate feeding unit through a single coax line. The transmission power is adjusted by the feeding unit based on the feedback received from the antenna unit. Hereinafter in this disclosure, "remote antenna unit" or "remote fixed gain antenna unit" refer to a remote antenna unit which transmits at fixed gain and includes power feedback functionality. The power control is performed over the single coax line.

Feedback and TX/RX control signals are transmitted through, and share the single coax line with, the RF signals. Thus, unlike in known art apparatus exemplified by embodiment 100, in apparatus embodiments disclosed herein the long coax line carries four types of inputs or signals: control, feedback, Receive RF and Transmit RF. This scheme is beneficial in that the gains of the power amplifier and low noise amplifier are higher than the coax line attenuation, avoiding performance degradation. Further advantages provided by this scheme include controllable transmission power, smaller remote antenna unit size and stable amplifier operation. A smaller number of coax lines and respective connectors lead to reduced remote antenna unit size and wiring costs. Clearly, a single coax line as provided herein is preferred over two separate coax lines, one for power feedback and one for TX/RX control.

In some embodiments, there is provided apparatus for RF communications comprising a remote fixed gain antenna unit coupled to an antenna and a feeding unit configured to provide transmit control signals to, and to receive power feedback signals from the remote antenna unit over a single coaxial line.

In some embodiments, there is provided apparatus for RF communications comprising: a remote fixed gain antenna unit coupled to an antenna, the antenna unit including power feedback functionality, and a feeding unit for controlling externally transmission power in the remote antenna unit based on power feedback received from the antenna unit.

In some embodiments there is provided apparatus for RF communications comprising: a remote fixed gain antenna unit operative to provide power feedback and a feeding unit spaced apart from, and coupled to the remote antenna unit by a single coaxial line, the feeding unit operative to control antenna unit output power based on the power feedback.

In some embodiments, there is provided a method for RF communications using a fixed gain remote antenna unit comprising the steps of: providing a feeding unit connected over a single coaxial line to the remote antenna unit, and, at the feeding unit, controlling a transmit power of the antenna by transmitting control signals to the antenna unit and receiving feedback signals from the antenna unit through the single coaxial line.

In some embodiments, the feeding unit includes a power control module which runs a control loop for adjusting the transmission power of a transceiver based on feedback received from the fixed gain antenna unit.

In some embodiments, the feeding unit includes a voltage termination used to set operating conditions of the power feedback and to determine a transmit or receive direction.

In some embodiments, the antenna unit includes a voltage detector used to provide the power feedback signals.

In some embodiments, the antenna unit and the feeding unit are included in a vehicle.

In some embodiments, the single coaxial line is a coax cable longer than about 1 meter for RF communications above 5 GHz.

BRIEF DESCRIPTION OF THE DRAWINGS

Non-limiting embodiments of the invention are herein described, by way of example only, with reference to the accompanying drawings, wherein.

DETAILED DESCRIPTION

Figure 1:
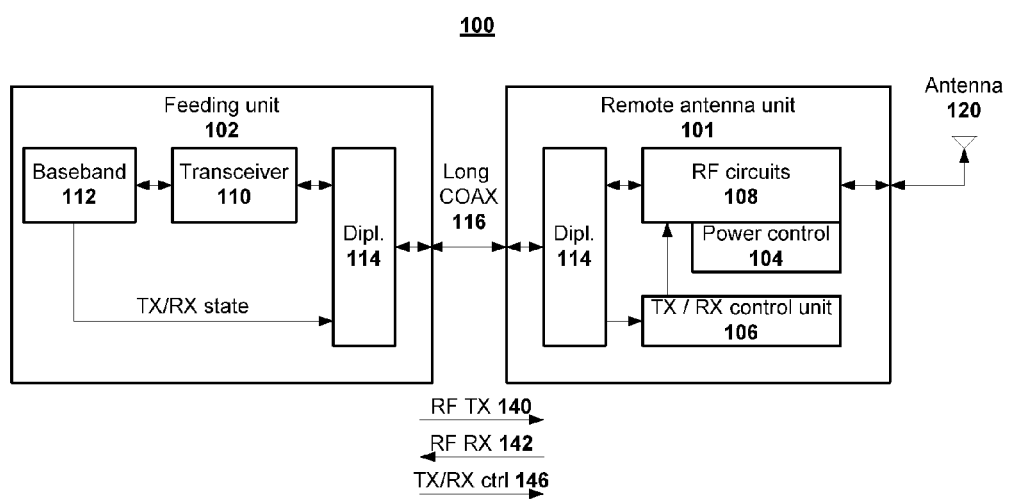
FIG. 1 illustrates a known apparatus which includes a variable gain remote antenna unit.
Figure 2:
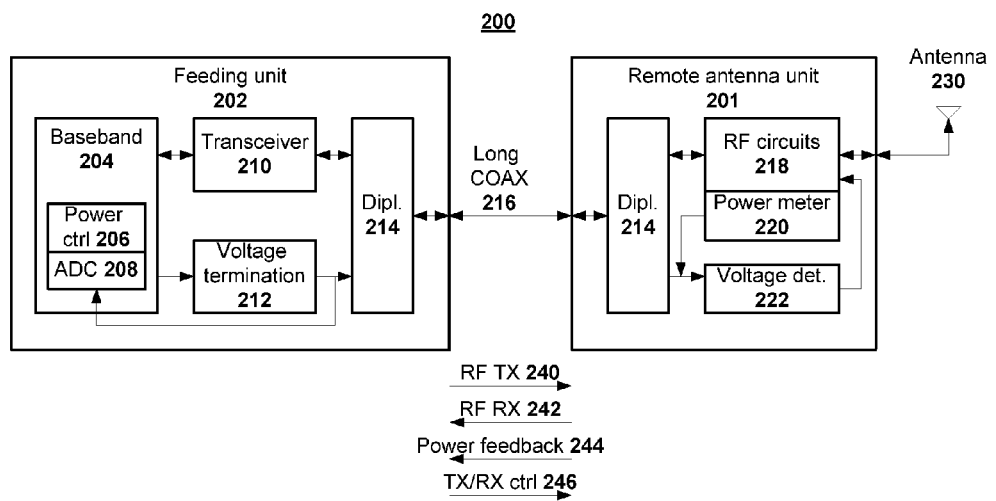
FIG. 2 illustrates an embodiment of an apparatus disclosed herein.

Returning now to the drawings, FIG. 2 illustrates an embodiment 200 of an apparatus disclosed herein. Embodiment 200 comprises a remote antenna unit 201 which includes a power meter 220, a voltage detector 222, RF circuits 218 and a diplexer 214. Apparatus 200 further comprises a feeding unit 202 which includes a transceiver 210, a baseband device 204, a voltage termination 212 and another diplexer 214. Units 201 and 202 are connected through a single coax line 216, which can be long. Coax line 216 carries four types of signals: Transmit RF signals 240, Receive RF signals 242, Power feedback signals 244, and TX/RX control signals 246. The Transmit RF and TX/RX control signals are sent from the feeding unit to the remote antenna unit, while the Receive RF and the Power feedback signals are sent in the opposite direction. Voltage termination 212 is used to set the operating conditions of the power feedback and determines the Transmit/Receive direction. Diplexers 214 are used to combine the feedback and control signals with (or separate them from) the RF signals on single coax line 216. The control signals are bi-directional, driven by voltage termination 212 and sampled by ADC 208. Baseband device 204 includes a power control module 206 and, optionally, an analog-to-digital converter (ADC) 208, the roles of which are described next.

In use, in Transmit mode, the output of voltage termination 212 is set to Low (preferably 0), while in Receive mode the output is set to High. The ADC samples the voltage level on the coax control signal (added to the diplexer at the bottom) to realize the power meter 220 reading. The value measured by the ADC is processed by power control module 206, which runs a control loop (not shown but known to one of ordinary skill in the art) and adjusts the output power gain as needed at transceiver 210. Voltage detector 212 determines whether transmission or reception occurs at present, therefore performing TX/RX control. The control module compares the measured power vs. the expected power of the power amplifier output and changes the gain as needed. The expected power varies per the desired Transmit power of a specific packet. The control mechanism compares the measurement packet-by-packet, and collects statistics for tracking the power changes, as would be clear to one of ordinary skill in the art. Power control module 206 may be implemented in hardware (HW) or in software (SW) running on a processor or central processing unit (CPU).

Figure 3:
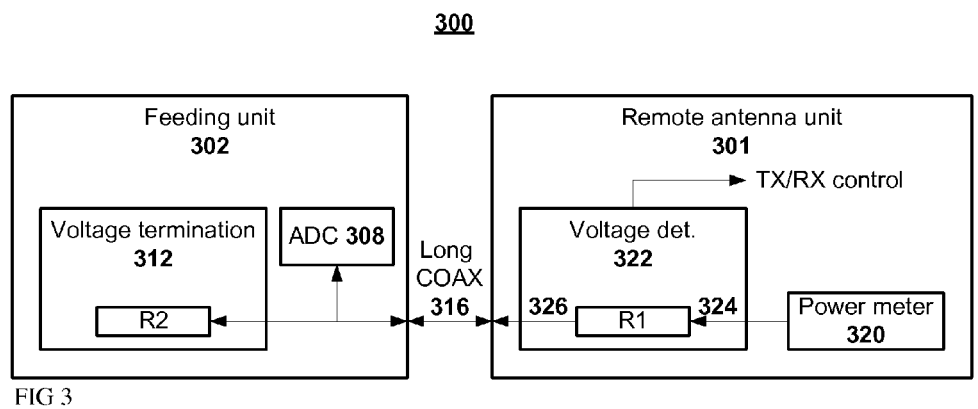
FIG. 3 shows a apparatus embodiment which zooms in on the control and feedback functionalities of the embodiment in FIG. 2.

FIG. 3 shows an embodiment 300 which zooms in on the control and feedback functionalities of apparatus 200. All apparatus 200 components are still here, but some are omitted while others are renumbered. Embodiment 300 comprises a remote variable gain antenna unit 301 coupled to a feeding unit 302 through a single coax line 316. Remote antenna unit 301 includes a power meter 320 connected through a resistor R1 to coax line 316, as well as a voltage detector 322. R1 is chosen to have a resistance much higher than the coax line serial DC resistance, which is fairly low, typically 10 Kohm. Feeding unit 302 includes a voltage termination 312 connected to coax line 316 through a resistor R2 and an ADC 308.

As in embodiment 200, the ADC samples the power feedback and the voltage termination is used for determining TX/RX control.

In use, in Transmit mode, the voltage termination is set to Low. The two resistors form a simple voltage divider. Assuming that R1 and R2 are identical, the voltage sampled by ADC 308 is half the voltage output by the power meter. The voltage on R1 is higher on a right side 324 and lower on a left side 326. In Receive mode, the voltage termination is set to High. The voltage on R1 is lower on the right side (point 324) and higher on the left side (point 326). Voltage detector 322 determines which side of the resistor has a higher voltage. This is typically implemented using an operational amplifier (not shown) inside detector 322. The comparison result is used as a TX/RX control signal sent to the RF circuits. Note that in general, resistors R1 and R2 may have different values. Large resistors will increase the response time due to the coax line capacitance.

Figure 4:
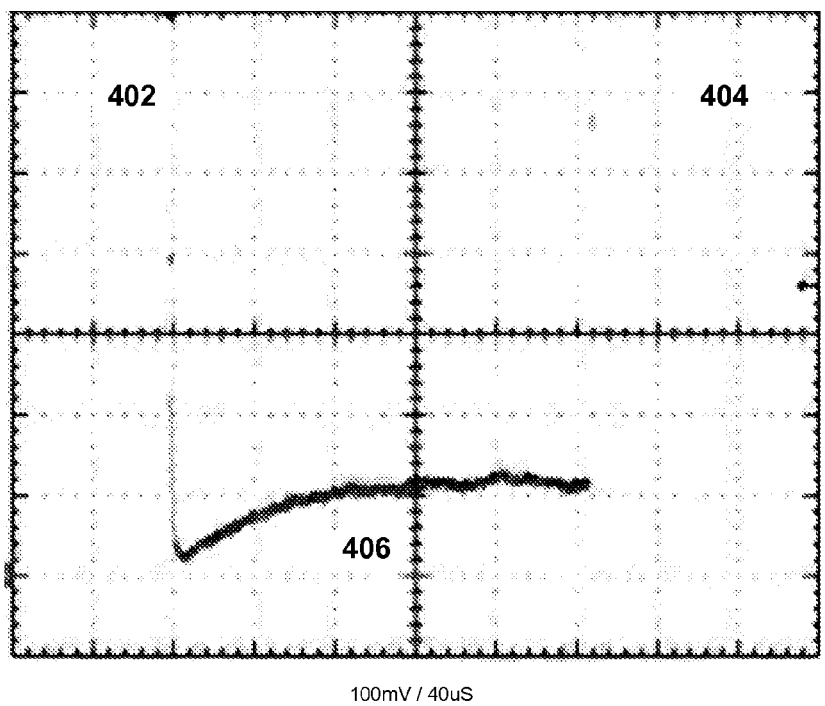
FIG. 4 shows experimentally captured control signals between the feeding unit and the remote fixed gain antenna unit.

FIG. 4 illustrates a capture of a control signal between the feeding and remote units in an apparatus as shown in FIG. 2.5, for 9 GHz RF transmission and +20 dBm output power. The coax line was 7 m long. In periods 402 and 404, the antenna is in Receive mode. The voltage termination is set to high, and the signal is high as well. In period 406, the operation is changed to Transmit. The voltage terminator is set to low. The measured voltage is the power meter measurement. The signal requires stabilization due to the coax line capacitance. The power control loop measures the power close to the packet end to complete the stabilization. The stabilization is evident in the signal level in period 406, where the level starts low and rises slowly until stabilized. FIG. 4 proves that bi-directional representation of the control and power feedback signal over a single long coax line is possible.

In summary, embodiments disclosed herein provide fixed gain remote antenna units with internal feedback, controlled by a separate control in a feeding unit using a single control line. Transmission power feedback is shared with TX/RX control inputs and RF signals over a single coax line.

While this disclosure has been described in terms of certain embodiments and generally associated methods, alterations and permutations of the embodiments and methods will be apparent to those skilled in the art. For example, most functions performed by electronic hardware components may be duplicated by software emulation. Thus, a software program written to accomplish those same functions may emulate the functionality of the hardware components. The disclosure is to be understood as not limited by the specific embodiments described herein, but only by the scope of the appended claims.

All patent applications and publications mentioned in this specification are herein incorporated in their entirety by reference into the specification, to the same extent as if each individual patent application or publication was specifically and individually indicated to be incorporated herein by reference. In addition, citation or identification of any reference in this application shall not be construed as an admission that such reference is available as prior art.

The invention claimed is:

1. Apparatus for radio frequency (RF) communications comprising:
    a) a remote fixed gain antenna unit coupled to an antenna; and
    b) a feeding unit configured to provide transmit control signals to, and to receive power feedback signals from the remote antenna unit over a single coaxial line, wherein the feeding unit includes a power control module which runs a control loop for adjusting antenna transmission power based on feedback received from the fixed gain antenna unit.

2. The apparatus of claim 1, wherein the antenna unit includes a voltage detector used to provide the power feedback signals.

3. The apparatus of claim 1, wherein the feeding unit includes a voltage termination used to set operating conditions of the power feedback and to determine a transmit or receive direction.

4. The apparatus of claim 1, wherein the single coaxial line is configured to carry RF signals in addition to the control and feedback signals.

5. The apparatus of claim 4, wherein the coaxial line is a coax cable longer than about 1 meter for RF communications above 5 GHz.

6. The apparatus of claim 1, wherein the antenna unit and the feeding unit are included in a vehicle.

7. Apparatus for radio frequency (RF) communications comprising:
    a) a remote fixed gain antenna unit coupled to an antenna, wherein the antenna unit includes power feedback functionality; and
    b) a feeding unit for controlling transmission power in the remote antenna unit based on power feedback provided by the remote antenna unit, wherein the antenna unit and the feeding unit are included in a vehicle.

8. The apparatus of claim 7, further comprising a single coaxial line coupling the remote antenna and the feeding unit and operative to carry control signals and RF transmit and receive signals from the feeding unit to the remote antenna unit together with power feedback signals from the remote antenna unit to the feeding unit.

9. The apparatus of claim 8, wherein the coaxial line is a coax cable longer than about 1 meter for RF communications above 5 GHz.

10. The apparatus of claim 7, wherein the feeding unit includes a power control module which runs a control loop for adjusting antenna transmission power based on feedback received from the fixed gain antenna unit.

11. The apparatus of claim 7, wherein the antenna unit includes a voltage detector used to provide the power feedback signals.

12. A method for radio frequency (RF) communications using a fixed gain remote antenna unit, comprising the steps of:
    a) providing a feeding unit connected over a single coaxial line to the remote antenna unit; and
    b) at the feeding unit, receiving feedback signals from the antenna unit through the single coaxial line and, based on the feedback, controlling a transmit power by transmitting control signals to the antenna unit, wherein the controlling includes running a control loop in the feeding unit which provides the control signals.

13. The method of claim 12, wherein the controlling further includes controlling the amplification of a power amplifier in the feeding unit.

14. The method of claim 12, further comprising the step of transmitting RF transmit and receive signals over the single coaxial line.

15. The method of claim 14, wherein the RF transmit and receive signals are transmitted together with the control and feedback signals.

16. The method of claim 14, wherein the antenna unit and the feeding unit are included in a vehicle.

17. The method of claim 12, wherein the coaxial line is a coax cable longer than about 1 meter for RF communications above 5 GHz.

\* \* \* \* \*